(12) United States Patent
Woods (10) Patent No.: US 7,731,802 B2
(45) Date of Patent: Jun. 8, 2010

(54) METHODS FOR TRANSITIONING A FLUID MENISCUS TO AND FROM SURFACES OF A SUBSTRATE

(75) Inventor: Carl Woods, Aptos, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 12/372,683

(22) Filed: Feb. 17, 2009

(65) Prior Publication Data
US 2009/0151753 A1 Jun. 18, 2009

Related U.S. Application Data

(60) Division of application No. 10/817,620, filed on Apr. 1, 2004, now Pat. No. 7,513,262, and a continuation-in-part of application No. 10/261,839, filed on Sep. 30, 2002, now Pat. No. 7,234,477.

(51) Int. Cl.
*B08B 3/00* (2006.01)

(52) U.S. Cl. .......................... 134/21; 134/34

(58) Field of Classification Search ............... 134/21, 134/26, 34, 36, 94.1, 95.2, 99.1, 102.3, 104.2, 134/902
See application file for complete search history.

(56) References Cited

U.S. PATENT DOCUMENTS

| 5,749,469 | A  | * | 5/1998  | Williams ................. 206/710 |
| 6,446,358 | B1 | * | 9/2002  | Mitsumori et al. ............ 34/611 |
| 2004/0083976 | A1 | * | 5/2004  | Meyyappan ................. 118/728 |
| 2004/0160582 | A1 | * | 8/2004  | Lof et al. ..................... 355/30 |
| 2004/0211920 | A1 | * | 10/2004 | Maria Derksen et al. . 250/492.1 |
| 2005/0064681 | A1 | * | 3/2005  | Wood et al. ................. 438/459 |

* cited by examiner

*Primary Examiner*—Joseph L Perrin
(74) *Attorney, Agent, or Firm*—Martine Penilla & Gencarella, LLP (57) ABSTRACT

Methods for processing a substrate with a fluid meniscus are provided. One method includes positioning a transition surface substantially coplanar to a substrate surface. The transition surface is defined to be adjacent to an edge of the substrate. And, moving a fluid meniscus between the transition surface and the substrate surface.

10 Claims, 10 Drawing Sheets

METHODS FOR TRANSITIONING A FLUID MENISCUS TO AND FROM SURFACES OF A SUBSTRATE

CLAIM OF PRIORITY

This application is a Divisional of prior application Ser. No. 10/817,620, filed Apr. 1, 2004, now U.S. Pat. No. 7,513,262 entitled "Substrate Meniscus Interface and Methods for Operation", and continuation-in-part Ser. No. 10/261,839 of U.S. Pat. No. 7,234,477, from which priority under 35 U.S.C. § 120 is claimed, entitled "Method and Apparatus for Drying Semiconductor Wafer Surfaces Using a Plurality of Inlets and Outlets Held in Close Proximity to the Wafer Surfaces", filed on Sep. 30, 2002. The aforementioned patent applications are hereby incorporated by reference.

BACKGROUND

1. Field of the Invention

The present invention relates to semiconductor wafer processing and, more particularly, to apparatuses and techniques for more efficiently applying and removing fluids from wafer surfaces while reducing contamination and decreasing wafer cleaning cost.

2. Description of the Related Art

In the semiconductor chip fabrication process, it is well-known that there is a need to process a wafer using operations such as etching, cleaning, drying, and plating. In each of these types of operations, liquids are typically either applied or removed for the etching, cleaning, drying, and plating processes.

For example, wafer cleaning may have to be conducted where a fabrication operation has been performed that leaves unwanted residues on the surfaces of wafers. Examples of such a fabrication operation include plasma etching (e.g., tungsten etch back (WEB)) and chemical mechanical polishing (CMP). In CMP, a wafer is placed in a holder which pushes a wafer surface against a rolling belt polisher. This belt polisher uses a slurry which consists of chemicals and abrasive materials to cause the polishing. Unfortunately, this process tends to leave an accumulation of slurry particles and residues at the wafer surface. If left on the wafer, the unwanted residual material and particles may cause, among other things, defects such as scratches on the wafer surface and inappropriate interactions between metallization features. In some cases, such defects may cause devices on the wafer to become inoperable. In order to avoid the undue costs of discarding wafers having inoperable devices, it is therefore necessary to clean the wafer adequately yet efficiently after fabrication operations that leave unwanted residues.

After a wafer has been wet cleaned, the wafer must be dried effectively to prevent water or cleaning fluid remnants from leaving residues on the wafer. If the cleaning fluid on the wafer surface is allowed to evaporate, as usually happens when droplets form, residues or contaminants previously dissolved in the cleaning fluid will remain on the wafer surface after evaporation (e.g., and form spots). To prevent evaporation from taking place, the cleaning fluid must be removed as quickly as possible without the formation of droplets on the wafer surface. In an attempt to accomplish this, one of several different drying techniques are employed such as spin drying, IPA, or Marangoni drying. All of these drying techniques utilize some form of a moving liquid/gas interface on a wafer surface which, if properly maintained, results in drying of a wafer surface without the formation of droplets. Unfortunately, if the moving liquid/gas interface breaks down, as often happens with all of the aforementioned drying methods, droplets form and evaporation occurs resulting in contaminants being left on the wafer surface.

Figure 1:
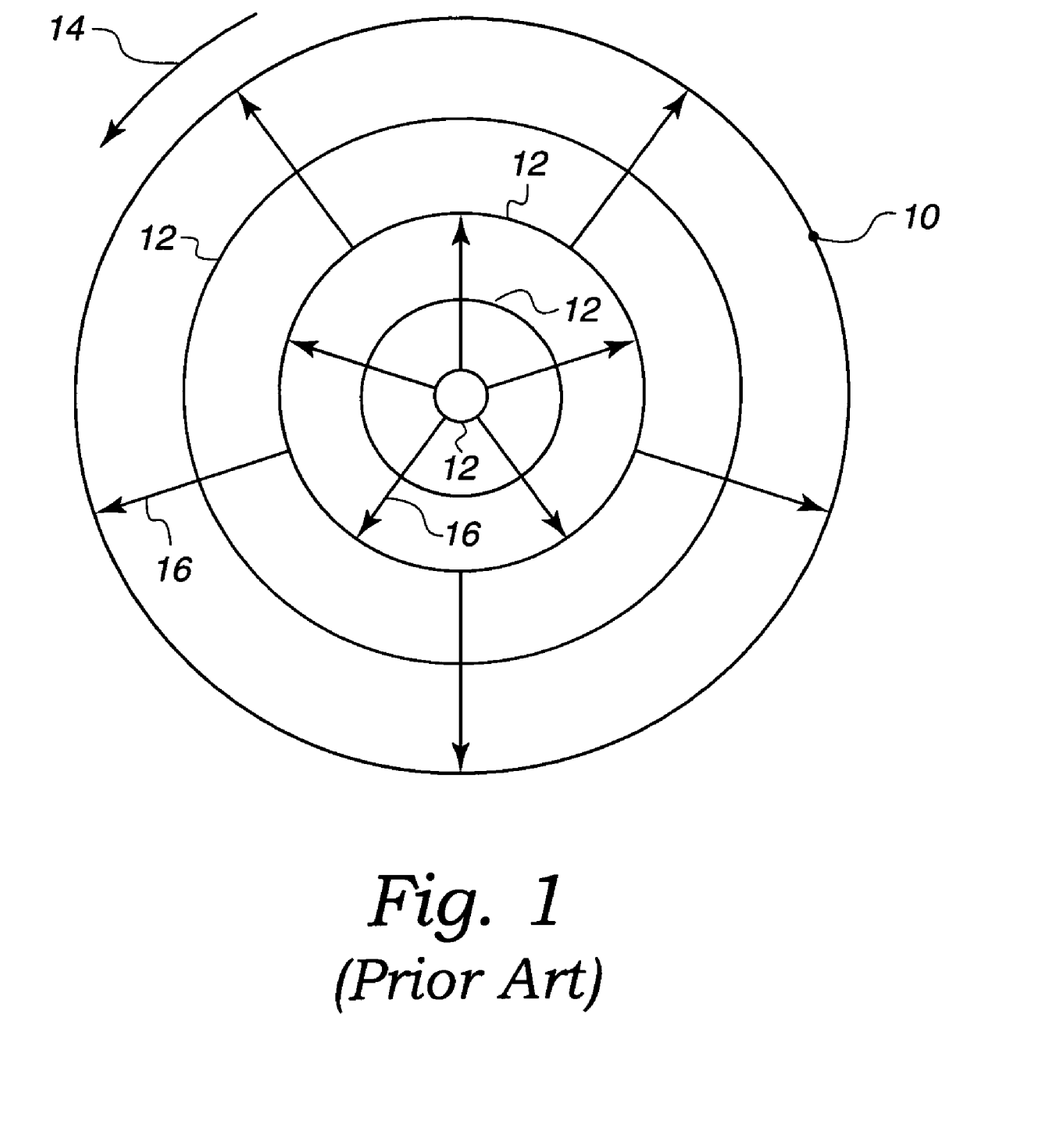
FIG. 1 illustrates movement of cleaning fluids on a wafer during an SRD drying process.

The most prevalent drying technique used today is spin rinse drying (SRD). FIG. 1 illustrates movement of cleaning fluids on a wafer 10 during an SRD drying process. In this drying process, a wet wafer is rotated at a high rate by rotation 14. In SRD, by use of centrifugal force, the water or cleaning fluid used to clean the wafer is pulled from the center of the wafer to the outside of the wafer and finally off of the wafer as shown by fluid directional arrows 16. As the cleaning fluid is being pulled off of the wafer, a moving liquid/gas interface 12 is created at the center of the wafer and moves to the outside of the wafer (i.e., the circle produced by the moving liquid/gas interface 12 gets larger) as the drying process progresses. In the example of FIG. 1, the inside area of the circle formed by the moving liquid/gas interface 12 is free from the fluid and the outside area of the circle formed by the moving liquid/gas interface 12 is the cleaning fluid. Therefore, as the drying process continues, the section inside (the dry area) of the moving liquid/gas interface 12 increases while the area (the wet area) outside of the moving liquid/gas interface 12 decreases. As stated previously, if the moving liquid/gas interface 12 breaks down, droplets of the cleaning fluid form on the wafer and contamination may occur due to evaporation of the droplets. As such, it is imperative that droplet formation and the subsequent evaporation be limited to keep contaminants off of the wafer surface. Unfortunately, the present drying methods are only partially successful at the prevention of moving liquid interface breakdown.

In addition, the SRD process has difficulties with drying wafer surfaces that are hydrophobic. Hydrophobic wafer surfaces can be difficult to dry because such surfaces repel water and water based (aqueous) cleaning solutions. Therefore, as the drying process continues and the cleaning fluid is pulled away from the wafer surface, the remaining cleaning fluid (if aqueous based) will be repelled by the wafer surface. As a result, the aqueous cleaning fluid will want the least amount of area to be in contact with the hydrophobic wafer surface. Additionally, the aqueous cleaning solution tends cling to itself as a result of surface tension (i.e., as a result of molecular hydrogen bonding). Therefore, because of the hydrophobic interactions and the surface tension, balls (or droplets) of aqueous cleaning fluid forms in an uncontrolled manner on the hydrophobic wafer surface. This formation of droplets results in the harmful evaporation and the contamination discussed previously. The limitations of the SRD are particularly severe at the center of the wafer, where centrifugal force acting on the droplets is the smallest. Consequently, although the SRD process is presently the most common way of wafer drying, this method can have difficulties reducing formation of cleaning fluid droplets on the wafer surface especially when used on hydrophobic wafer surfaces.

Additionally, in other wafer processing operations such as cleaning, etching, and plating, there are also problems with applying the fluids to the wafer and removing fluids from the wafer in an efficient manner that decreases contamination and increases wafer yield.

Therefore, there is a need for a method and an apparatus that avoids the prior art by enabling optimized fluid management and application to a wafer that reduces contaminating deposits on the wafer surface. Such deposits as often occurs today reduce the yield of acceptable wafers and increase the cost of manufacturing semiconductor wafers.

SUMMARY

Broadly speaking, the present invention fills these needs by providing a substrate processing (e.g., drying, cleaning, etching, plating, etc.) apparatus that is capable of managing fluids on wafer surfaces while at the same time reducing wafer contamination. It should be appreciated that the present invention can be implemented in numerous ways, including as a process, an apparatus, a system, a device or a method. Several inventive embodiments of the present invention are described below.

In one embodiment, an apparatus for processing a substrate with a fluid meniscus to be applied to a surface of the substrate is provided which includes a docking surface configured to be placed adjacent to an edge of the substrate where the docking surface is in the same plane as the substrate. The docking surface provides a transition interface to allow the fluid meniscus to enter and exit the surface of the substrate.

In yet another embodiment, an apparatus for use in processing a substrate is provided which includes a coupon magazine configured to hold a docking station for a proximity head where the coupon magazine is configured so the docking station is held in place adjacent to an edge of the substrate.

In another embodiment, a method for processing a substrate is provided which includes positioning a transition surface substantially coplanar to a substrate surface where the transition surface being adjacent to an edge of the substrate. The method further includes moving a fluid meniscus between the transition surface and the substrate surface.

The advantages of the present invention are numerous. Most notably, the apparatuses and methods described herein efficiently process (clean, dry, etch, plate, and other suitable type of wafer processing that involves optimal management of fluid application and/or removal from the wafer) semiconductor wafer while reducing unwanted fluids and contaminants remaining on a wafer surface. Consequently, wafer processing and production may be increased and higher wafer yields may be achieved due to efficient wafer processing.

The present invention enables the improved processing through the use of vacuum fluid removal in conjunction with processing fluid input that may be applied through usage of a multi-module manifold which is configurable in any one of numerous ways through the interchanging of one or more manifold sections.

The pressures generated on a fluid film at the wafer surface by the aforementioned forces enable optimal application and/or removal of fluid at the wafer surface with a significant reduction in remaining contamination as compared with other processing techniques. In addition, the present invention may utilize application of an isopropyl alcohol (IPA) vapor and processing fluid towards a wafer surface along with generation of a vacuum near the wafer surface at substantially the same time. This enables both the generation and intelligent control of a meniscus and the reduction of fluid surface tension along a processing fluid interface and therefore enables optimal application and/or removal of fluids from the wafer surface without leaving contaminants. The meniscus generated by input of IPA, processing fluid and output of fluids may be moved along the surface of the wafer to process the wafer.

In one embodiment, a coupon magazine may be utilized to effectively hold and position a docking station. The docking station (may also be known as a coupon) can simulate a wafer surface so when the fluid meniscus generated by the proximity head(s) are moved off (or on) the wafer surface, the docking station may provide a substantially continuous surface for the meniscus to track therefore enhancing meniscus stability. In addition, the coupon magazine may be leveled so that the docking station can be made substantially coplanar with the wafer being processed. Therefore, the coupon magazine may be utilized in any suitable wafer processing operation using the fluid meniscus. In this fashion, wafer processing can be intelligently enhanced and optimized.

Other aspects and advantages of the present invention will become apparent from the following detailed description, taken in conjunction with the accompanying drawings, illustrating by way of example the principles of the present invention.

BRIEF DESCRIPTION OF THE DRAWINGS

The present invention will be readily understood by the following detailed description in conjunction with the accompanying drawings. To facilitate this description, like reference numerals designate like structural elements.

DETAILED DESCRIPTION

An invention for methods and apparatuses for processing a substrate is disclosed. In the following description, numerous specific details are set forth in order to provide a thorough understanding of the present invention. It will be understood, however, by one of ordinary skill in the art, that the present invention may be practiced without some or all of these specific details. In other instances, well known process operations have not been described in detail in order not to unnecessarily obscure the present invention.

While this invention has been described in terms of several preferable embodiments, it will be appreciated that those skilled in the art upon reading the preceding specifications and studying the drawings will realize various alterations, additions, permutations and equivalents thereof. It is therefore intended that the present invention includes all such alterations, additions, permutations, and equivalents as fall within the true spirit and scope of the invention.

The figures below illustrate embodiments of an exemplary wafer processing system proximity heads to generate a specific shape, size, and location of a fluid meniscus. In one embodiment, the technology utilized herein may be known as a meniscus vacuum IPA vapor (MVIV) technology. This technology may be utilized to perform any suitable type of wafer operation such as, for example, meniscus vacuum IPA vapor drying (MVIVD), meniscus vacuum IPA vapor cleaning (MVIVC), meniscus vacuum IPA vapor etching (MVIVE), meniscus vacuum IPA vapor plating (MVIVP), etc. It should be appreciated that the system is exemplary, and that any other suitable type of configuration that would enable movement of the proximity head(s) into close proximity to the wafer may be utilized. In the embodiments shown, the proximity head(s) may move in a linear fashion from a center portion of the wafer to the edge of the wafer. It should be appreciated that other embodiments may be utilized where the proximity head(s) move in a linear fashion from one edge of the wafer to another diametrically opposite edge of the wafer, or other non-linear movements may be utilized such as, for example, in a radial motion, in a circular motion, in a spiral motion, in a zig-zag motion, in a random motion, etc. In addition, the motion may also be any suitable specified motion profile as desired by a user. In addition, in one embodiment, the wafer may be rotated and the proximity head moved in a linear fashion so the proximity head may process all portions of the wafer. It should also be understood that other embodiments may be utilized where the wafer is not rotated but the proximity head is configured to move over the wafer in a fashion that enables processing of all portions of the wafer. In addition, the proximity head and the wafer processing system as described herein may be utilized to process any shape and size of substrates such as for example, 200 mm wafers, 300 mm wafers, flat panels, etc. The processing system may be configured to be utilized for any suitable processing (e.g., plating, etching, cleaning, drying, etc.) of the wafer depending on the configuration of the system.

A fluid meniscus can be supported and moved (e.g., onto, off of and across a wafer) with a proximity head. Various proximity heads and methods of using the proximity heads are described in co-owned U.S. patent application Ser. No. 10/330,843 filed on Dec. 24, 2002 and entitled "Meniscus, Vacuum, IPA Vapor, Drying Manifold," which is a continuation-in-part of U.S. patent application Ser. No. 10/261,839 filed on Sep. 30, 2002 and entitled "Method and Apparatus for Drying Semiconductor Wafer Surfaces Using a Plurality of Inlets and Outlets Held in Close Proximity to the Wafer Surfaces," both of which are incorporated herein by reference in its entirety. Additional embodiments and uses of the proximity head are also disclosed in U.S. patent application Ser. No. 10/330,897, filed on Dec. 24, 2002, entitled "System for Substrate Processing with Meniscus, Vacuum, IPA vapor, Drying Manifold" and U.S. patent application Ser. No. 10/404,692, filed on Mar. 31, 2003, entitled "Methods and Systems for Processing a Substrate Using a Dynamic Liquid Meniscus." Still additional embodiments of the proximity head are described in U.S. patent application Ser. No. 10/404, 270, filed on Mar. 31, 2003, entitled "Vertical Proximity Processor," U.S. patent application Ser. No. 10/603,427, filed on Jun. 24, 2003, and entitled "Methods and Systems for Processing a Bevel Edge of a Substrate Using a Dynamic Liquid Meniscus," U.S. patent application Ser. No. 10/606, 022, filed on Jun. 24, 2003, and entitled "System and Method for Integrating In-Situ Metrology within a Wafer Process," U.S. patent application Ser. No. 10/607,611 filed on Jun. 27, 2003 entitled "Apparatus and Method for Depositing and Planarizing Thin Films of Semiconductor Wafers," U.S. patent application Ser. No. 10/611,140 filed on Jun. 30, 2003 entitled "Method and Apparatus for Cleaning a Substrate Using Megasonic Power," and U.S. patent application Ser. No. 10/742,303 entitled "Proximity Brush Unit Apparatus and Method." The aforementioned patent applications are hereby incorporated by reference in their entirety.

As described herein a coupon magazine may hold and position a docking station so the docking station can be located off the edge of the wafer and therefore simulate a wafer surface as a fluid meniscus is moved off (or on) the wafer. The docking station (may also be known as a coupon) can therefore provide a substantially continuous surface for the meniscus to track therefore enhancing meniscus stability. The coupon magazine may also be configured to level the docking station so that the docking station is substantially level (or coplanar) with the wafer being processed. By having the docking station substantially coplanar with the wafer, the fluid meniscus may move on (or off) the wafer and keep meniscus stability intact.

Figure 2A:
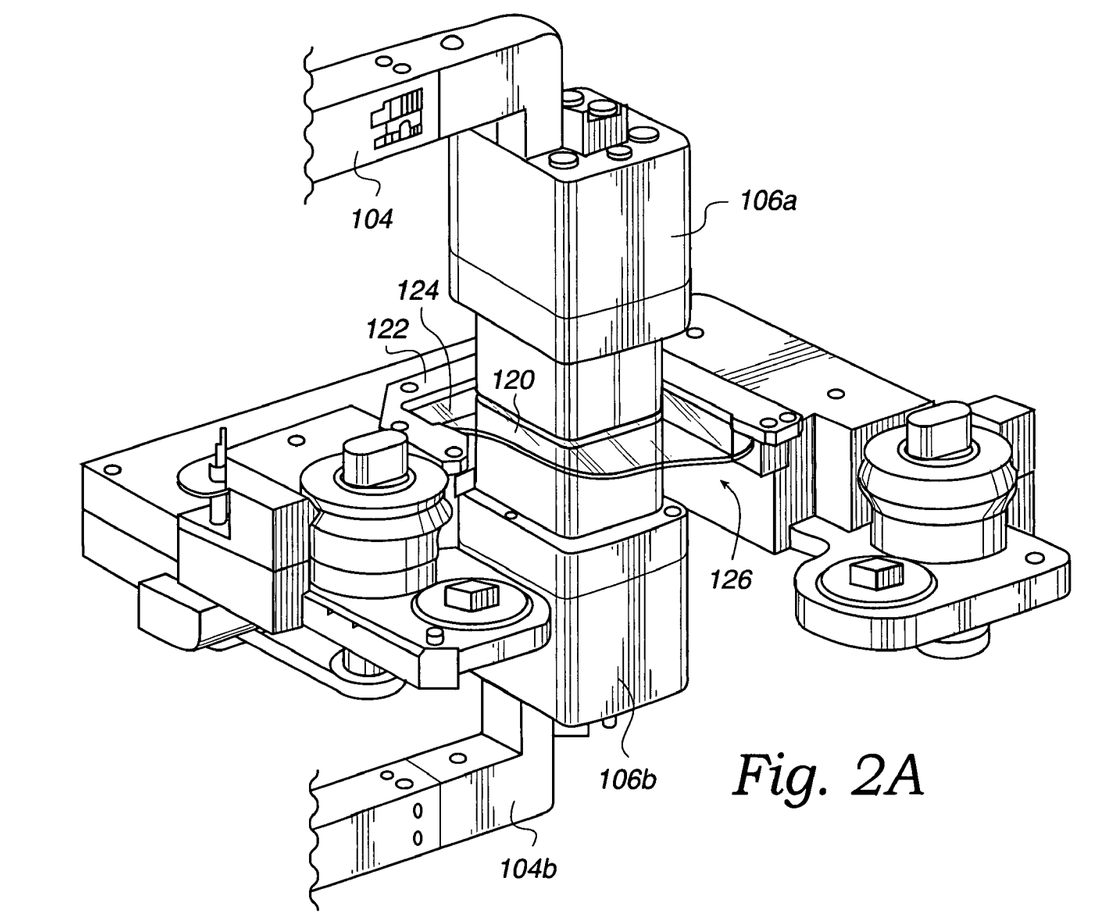
FIG. 2A shows a wafer processing system in accordance with one embodiment of the present invention.

FIG. 2A shows a wafer processing system 100 in accordance with one embodiment of the present invention. The system 100 includes rollers 102a and 102b which may hold and/or rotate a wafer to enable wafer surfaces to be processed. The system 100 also includes proximity heads 106a and 106b that, in one embodiment, are attached to an upper arm 104a and to a lower arm 104b respectively. The proximity head may be any suitable apparatus that may generate a fluid meniscus. The upper arm 104a and the lower arm 104b can be part of an assembly which enables substantially linear movement of the proximity heads 106a and 106b along a radius of the wafer. In yet another embodiment, the assembly may move the proximity heads 106a and 106b in any suitable user defined movement.

In one embodiment the arms 104 are configured to hold the proximity head 106a above the wafer and the proximity head 106b below the wafer in close proximity to the wafer. For example, in one exemplary embodiment this may be accomplished by having the upper arm 104a and the lower arm 104b be movable in a vertical manner so once the proximity heads are moved horizontally into a location to start wafer processing, the proximity heads 106a and 106b can be moved vertically to a position in close proximity to the wafer. In another embodiment, the upper arm 104a and the lower arm 104b may be configured to start the proximity heads 106a and 106b in a position where a meniscus is generated before processing and the meniscus that has already been generated between the proximity heads 106a and 106 may be moved onto the wafer surface to be processed from an edge area of a wafer 108. Therefore, the upper arm 104a and the lower arm 104b may be configured in any suitable way so the proximity heads 106a and 106b can be moved to enable wafer processing as described herein. It should also be appreciated that the system 100 may be configured in any suitable manner as long as the proximity head(s) may be moved in close proximity to the wafer to generate and control a meniscus. It should also be understood that close proximity may be any suitable distance from the wafer as long as a meniscus may be maintained. In one embodiment, the proximity heads 106a and 106b (as well as any other proximity head described herein) may each be located between about 0.1 mm to about 10 mm from the wafer to generate the fluid meniscus on the wafer surface. In a preferable embodiment, the proximity heads 106a and 106b (as well as any other proximity head described herein) may each be located bout 0.5 mm to about 2.0 mm from the wafer to generate the fluid meniscus on the wafer surface, and in more preferable embodiment, the proximity heads 106a and 106b (as well as any other proximity head described herein) may be located about 1.50 mm from the wafer to generate the fluid meniscus on the wafer surface.

In one embodiment, the system 100, the arms 104 are configured to enable the proximity heads 106a and 106b to be moved from processed to unprocessed portions of the wafer. It should be appreciated that the arms 104 may be movable in any suitable manner that would enable movement of the proximity heads 106a and 106b to process the wafer as desired. In one embodiment, the arms 104 may be motivated by a motor to move the proximity head 106a and 106b along the surface of the wafer. It should be understood that although the wafer processing system 100 is shown with the proximity heads 106a and 106b, that any suitable number of proximity heads may be utilized such as, for example, 1, 2, 3, 4, 5, 6, etc. The proximity heads 106a and/or 106b of the wafer processing system 100 may also be any suitable size or shape as shown by, for example, any of the proximity heads as described herein. The different configurations described herein generate a fluid meniscus between the proximity head and the wafer. The fluid meniscus may be moved across the wafer to process the wafer by applying fluid to the wafer surface and removing fluids from the surface. In such a way, depending on the fluids applied to the wafer, cleaning, drying, etching, and/or plating may be accomplished. Therefore, the proximity heads 106a and 106b can have any numerous types of configurations as shown herein or other configurations that enable the processes described herein. It should also be appreciated that the system 100 may process one surface of the wafer or both the top surface and the bottom surface of the wafer.

In addition, besides processing the top and/or bottom surfaces of the wafer, the system 100 may also be configured to process one side of the wafer with one type of process (e.g., etching, cleaning, drying, plating, etc.) and process the other side of the wafer using the same process or a different type of process by inputting and outputting different types of fluids or by using a different configuration meniscus. The proximity heads can also be configured to process the bevel edge of the wafer in addition to processing the top and/or bottom of the wafer. This can be accomplished by moving the meniscus off (or onto) the edge the wafer which processes the bevel edge. It should also be understood that the proximity heads 106a and 106b may be the same type of apparatus or different types of proximity heads.

The wafer 108 may be held and rotated by the rollers 102a and 102b in any suitable orientation as long as the orientation enables a desired proximity head to be in close proximity to a portion of the wafer 108 that is to be processed. In one embodiment, the rollers 102a and 102b can rotate in a clockwise direction to rotate the wafer 108 in a counterclockwise direction. It should be understood that the rollers may be rotated in either a clockwise or a counterclockwise direction depending on the wafer rotation desired. In one embodiment, the rotation imparted on the wafer 108 by the rollers 102a and 102b serves to move a wafer area that has not been processed into close proximity to the proximity heads 106a and 106b. However, the rotation itself does not dry the wafer or move fluid on the wafer surfaces towards the edge of the wafer. Therefore, in an exemplary wafer processing operation, the unprocessed areas of the wafer would be presented to the proximity heads 106a and 106b through both the linear motion of the proximity heads 106a and 106b and through the rotation of the wafer 108. The wafer processing operation itself may be conducted by at least one of the proximity heads. Consequently, in one embodiment, processed portions of the wafer 108 would expand from a center region to the edge region of the wafer 108 in a spiral movement as the processing operation progresses. In another embodiment, when the proximity heads 106a and 106b are moved from the periphery of the wafer 108 to the center of the wafer 108, the processed portions of the wafer 108 would expand from the edge region of the wafer 108 to the center region of the wafer 108 in a spiral movement.

In an exemplary processing operation, it should be understood that the proximity heads 106a and 106b may be configured to dry, clean, etch, and/or plate the wafer 108. In an exemplary drying embodiment, the at least one of first inlet may be configured to input deionized water (DIW) (also known as a DIW inlet), the at least one of a second inlet may be configured to input $N_2$ carrier gas containing isopropyl alcohol (IPA) in vapor form (also known as IPA inlet), and the at least one outlet may be configured to remove fluids from a region between the wafer and a particular proximity head by applying vacuum (also known as vacuum outlet). It should be appreciated that although IPA vapor is used in some of the exemplary embodiments, any other type of vapor may be utilized such as for example, nitrogen, any suitable alcohol vapor, organic compounds, volatile chemicals, etc. that may be miscible with water. It should be appreciated that any suitable alcohol vapor may contain any suitable types of alcohols. It should be appreciated that the any suitable alcohol can be any suitable carbon-based chemical with a hydroxy group attached to a saturated carbon atom.

In an exemplary cleaning embodiment, a cleaning solution may be substituted for the DIW. An exemplary etching embodiment may be conducted where an etchant may be substituted for the DIW. In an additional embodiment, plating may be accomplished as described in further detail in reference to U.S. patent application Ser. No. 10/607,611 filed on Jun. 27, 2003 entitled "Apparatus and Method for Depositing and Planarizing Thin Films of Semiconductor Wafers" which was incorporated by reference above. In addition, other types of solutions may be inputted into the first inlet and the second inlet depending on the processing operation desired.

It should be appreciated that the inlets and outlets located on a face of the proximity head may be in any suitable configuration as long as a stable meniscus as described herein may be utilized. In one embodiment, the at least one $N_2$/IPA vapor inlet may be adjacent to the at least one vacuum outlet which is in turn adjacent to the at least one processing fluid inlet to form an IPA-vacuum-processing fluid orientation. It should be appreciated that other types of orientations such as IPA-processing fluid-vacuum, processing fluid-vacuum-IPA, vacuum-IPA-processing fluid, etc. may be utilized depending on the wafer processes desired and what type of wafer processing mechanism is sought to be enhanced. In a preferable embodiment, the IPA-vacuum-processing fluid orientation may be utilized to intelligently and powerfully generate, control, and move the meniscus located between a proximity head and a wafer to process wafers. The processing fluid inlets, the $N_2$/IPA vapor inlets, and the vacuum outlets may be arranged in any suitable manner if the above orientation is maintained. For example, in addition to the $N_2$/IPA vapor inlet, the vacuum outlet, and the processing fluid inlet, in an additional embodiment, there may be additional sets of IPA vapor outlets, processing fluid inlets and/or vacuum outlets depending on the configuration of the proximity head desired. It should be appreciated that the exact configuration of the IPA-vacuum-processing fluid orientation may be varied depending on the application. For example, the distance between the IPA input, vacuum, and processing fluid input locations may be varied so the distances are consistent or so the distances are inconsistent. In addition, the distances between the IPA input, vacuum, and processing fluid output may differ in magnitude depending on the size, shape, and configuration of the proximity head 106a and the desired size of a process meniscus (i.e., meniscus shape and size). In addition, exemplary IPA-vacuum-processing fluid orientation may be found as described in the applications referenced above.

In one embodiment, the proximity heads 106a and 106b may be positioned in close proximity to a top surface and a bottom surface respectively of the wafer 108 and may utilize the IPA and DIW inlets and a vacuum outlet(s) to generate wafer processing meniscuses in contact with the wafer 108 which are capable of processing the top surface and the bottom surface of the wafer 108. The wafer processing meniscus may be generated in accordance with the descriptions in reference to applications referenced and incorporated by reference above. At substantially the same time the IPA and the processing fluid is inputted, a vacuum may be applied in close proximity to the wafer surface to remove the IPA vapor, the processing fluid, and/or the fluids that may be on the wafer surface. It should be appreciated that although IPA is utilized in the exemplary embodiment, any other suitable type of vapor may be utilized such as for example, nitrogen, any suitable alcohol vapor, organic compounds, hexanol, ethyl glycol, acetone, etc. that may be miscible with water. These fluids may also be known as surface tension reducing fluids. The portion of the processing fluid that is in the region between the proximity head and the wafer is the meniscus. It should be appreciated that as used herein, the term "output" can refer to the removal of fluid from a region between the wafer 108 and a particular proximity head, and the term "input" can be the introduction of fluid to the region between the wafer 108 and the particular proximity head.

The fluid meniscus may be moved on (or off) of the wafer at an edge of the wafer 108. For fluid meniscus removal and/or application on the periphery of the wafer 108, in one embodiment, the system 100 includes a coupon magazine 126 attached on a top surface of a wafer processing assembly. In one embodiment, coupon assembly 126 includes a bottom plate 124 and top portion 122. The coupon assembly 126 may be configured to hold a docking station 120 in an accurate static position that is substantially planar to a wafer plane and between the proximity heads 106a and 106b. In a preferable embodiment, when the docking station 120 is not substantially coplanar with the wafer plane, the docking station 120 may be adjusted with a leveling mechanism (as discussed in further detail in reference to FIG. 7) so the wafer 108 is substantially coplanar with the docking station. Therefore, the docking station may emulate a wafer surface when the process being conducted by the proximity head 106 is ending and transitioning off of the wafer surface as described in further detail in reference to FIG. 2B. It should be appreciated that the docking station 120 as described herein may be made from any suitable hydrophilic material such as, for example, quartz, ceramic, etc. The docking station may have a docking surface for the fluid meniscus that is adjacent to an edge of the substrate where the docking surface is in the same plane as the substrate. The docking surface of the docking station may provide a transition interface to allow the fluid meniscus to enter and exit the surface of the substrate. In one embodiment, the docking surface has a radial contour that matches a radial contour of the substrate. As a result, the docking surface may provide a transition interface for a fluid meniscus of the proximity head. Therefore, by providing a substantially continuous simulate wafer surface, the meniscus that is transitioning onto or off of the wafer 108 may remain stable.

It should be appreciated that the coupon magazine 126 may be designed with a specific intent to securely hold and level a substrate of regular or irregular geometric shape in a static position for processing when using the proximity head technology. In addition, the coupon magazine 126 may be utilized with any suitable proximity head operation such as, for example, etching, cleaning, drying, plating, etc.

In one embodiment, the coupon magazine 126 is attached to a coupon magazine mount 128. In one embodiment, the coupon magazine 126 and the coupon magazine mount 128 may be known as a coupon magazine assembly.

Figure 2B:
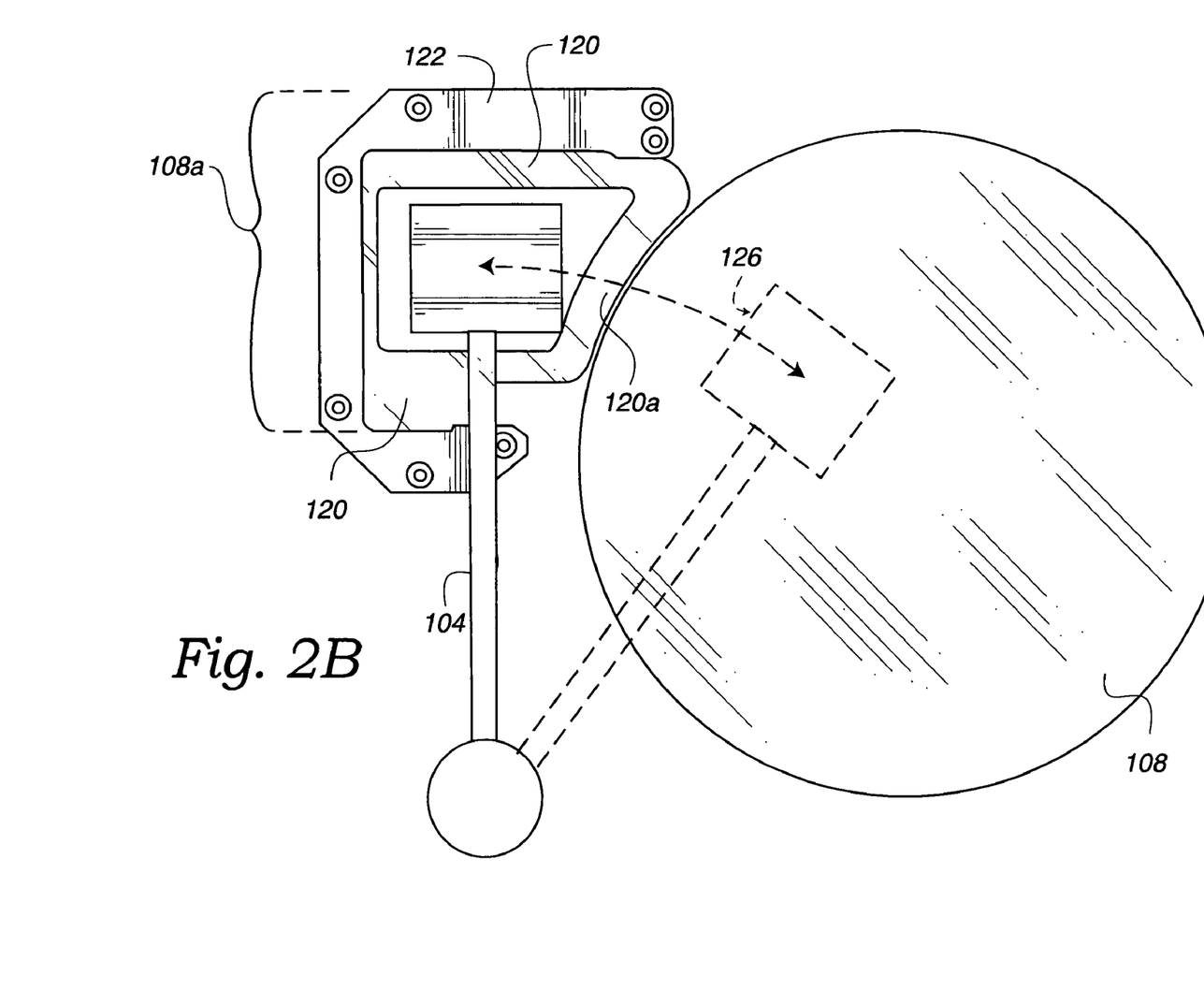
FIG. 2B illustrates an exemplary proximity head docking operation using the docking station in accordance with one embodiment of the present invention.

FIG. 2B illustrates an exemplary proximity head docking operation using the docking station 120 in accordance with one embodiment of the present invention. The docking station 120 may include a surface 120a that may simulate an arc curvature 108a so that a meniscus formed on the wafer 108 may travel off onto the docking station 120 without a breakdown in the meniscus. In one exemplary embodiment, the proximity head 106 may be moved from a location 127 of the wafer 108 to a location off of the wafer onto the docking station 120. The docking station is held onto place in the coupon magazine 122.

Figure 2C:
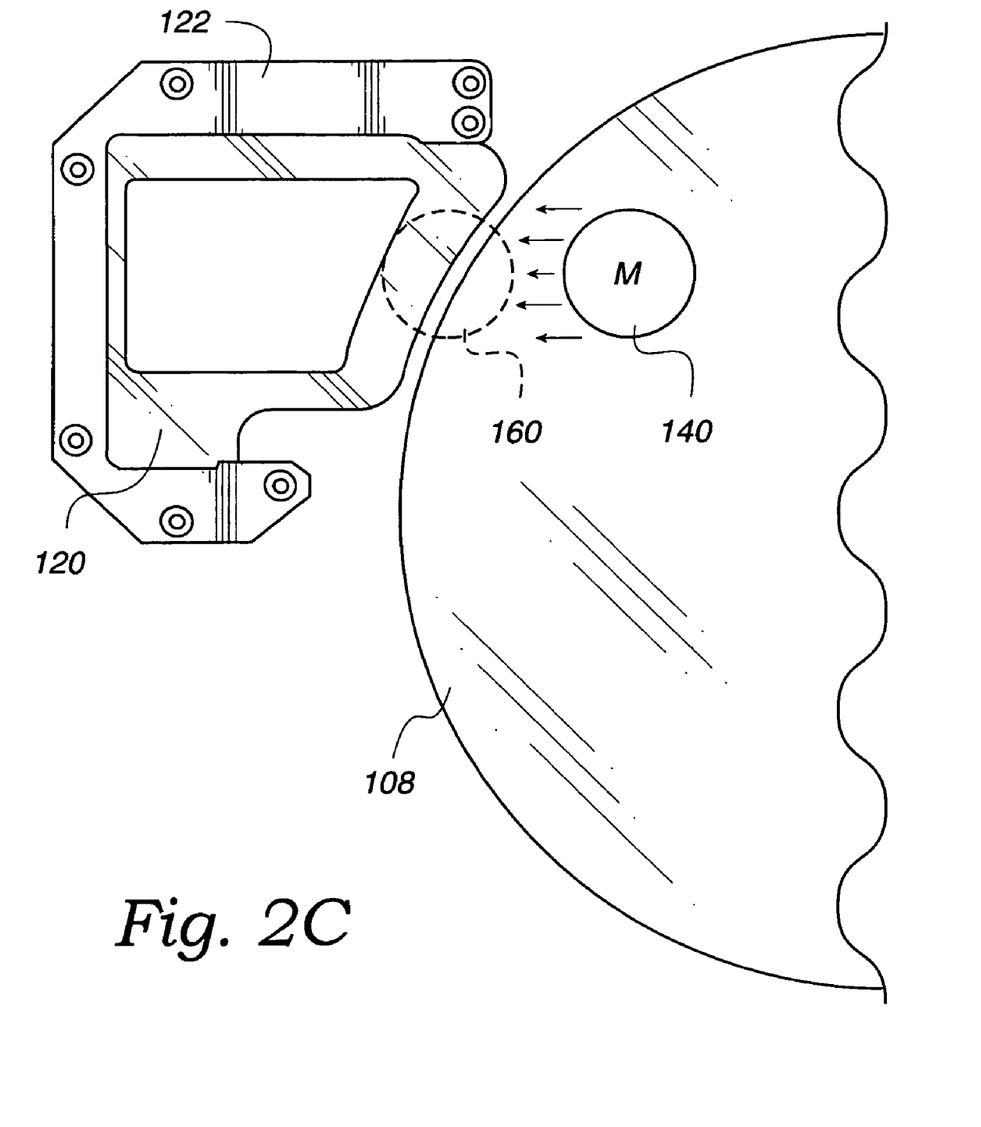
FIG. 2C shows a meniscus traveling off of the wafer onto the docking station in accordance with one embodiment of the present invention.

FIG. 2C shows a meniscus traveling off of the wafer 108 onto the docking station 120 in accordance with one embodiment of the present invention. In one exemplary embodiment, a meniscus 140 formed by the proximity head 106 may be used to process a wafer surface of the wafer 108 as described in further detail in the applications. The meniscus 140 may be moved from the wafer to a location 160. The location 160 includes a portion of the docking station 120 that simulates a surface of the wafer 108. It should be appreciated that the docking station 120 may be configured in any suitable fashion that enables the simulation of the wafer surface to keep the meniscus 140 stable. It should also be understood that the docking station may be any suitable distance away from the wafer 108 that can effectively enable the docking station 120 to simulate a wafer surface as the meniscus 140 is moving off of the wafer 108. In one embodiment, distance of the closest portion of the docking station 120 to the wafer is between 0.01 mm and 10.0 mm. In a preferable embodiment, the docking station 120 is located about 0.1 mm away from the wafer 108.

Figure 3:
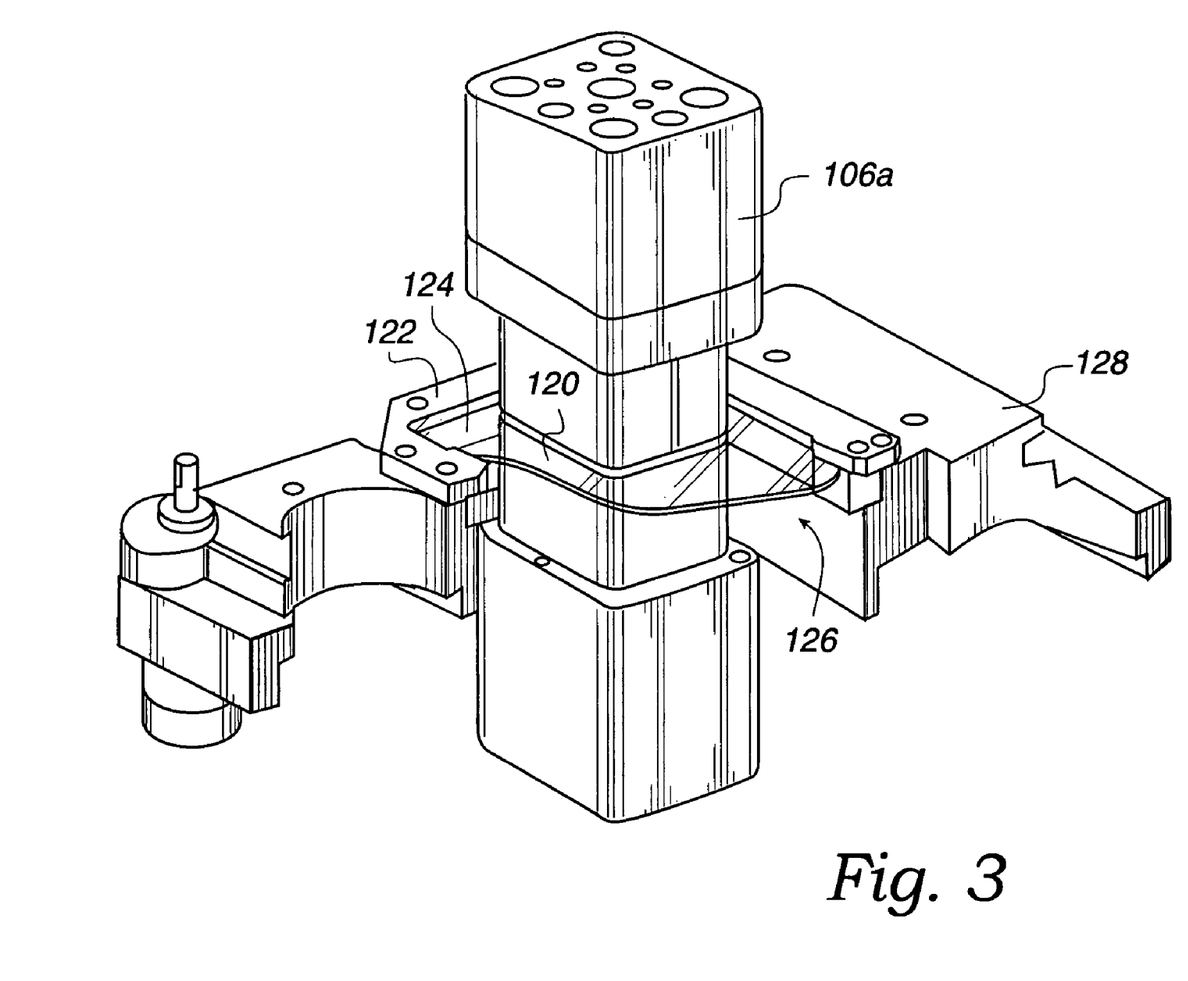
FIG. 3 illustrates a close up view of the wafer processing system without some of the components to show a better view of the coupon magazine in accordance with one embodiment of the present invention.

FIG. 3 illustrates a close up view of the wafer processing system 100 without some of the components to show a better view of the coupon magazine 126 in accordance with one embodiment of the present invention. The coupon magazine 126 may include a top portion 122 attached to a bottom portion 124. In such an embodiment, the top portion 122 and the bottom portion 124 may be attached with at least a portion of the docking station being located between the top portion 122 and the bottom portion 124. In one embodiment, the coupon magazine 126 is a device holder that may be fabricated from chemically compatible and mechanically stable materials such as, for example, polyethylene terephthalate (PET), Polyvinylidene Fluoride (PVDF), polyetheretherketone (PEEK), etc. The coupon magazine 126 may be machined with precise features to specific tolerances as desired. The coupon magazine 126 may be configured to be securely and accurately position a substrate of any suitable geometric size, shape, and thickness between, over, or under any suitable combination of proximity heads. Proximity heads as described herein and described in the U.S. patent applications referenced above may also be known as MVIV manifolds. The coupon magazine 126 may be used on any suitable lab test fixture or in any suitable production apparatus that may use proximity heads. The docking station 120 may be made substantially planar to the wafer surface by adjusting or leveling the coupon magazine 126 as discussed in reference to FIG. 7. In one embodiment, either or both of the coupon magazine 126 or the coupon magazine mount 128 may be adjusted to make the docking station 120 coplanar with the wafer surface. Therefore, the coupon magazine 126 is extremely flexible in use and may intelligently and powerfully optimize wafer processing operations.

Figure 4:
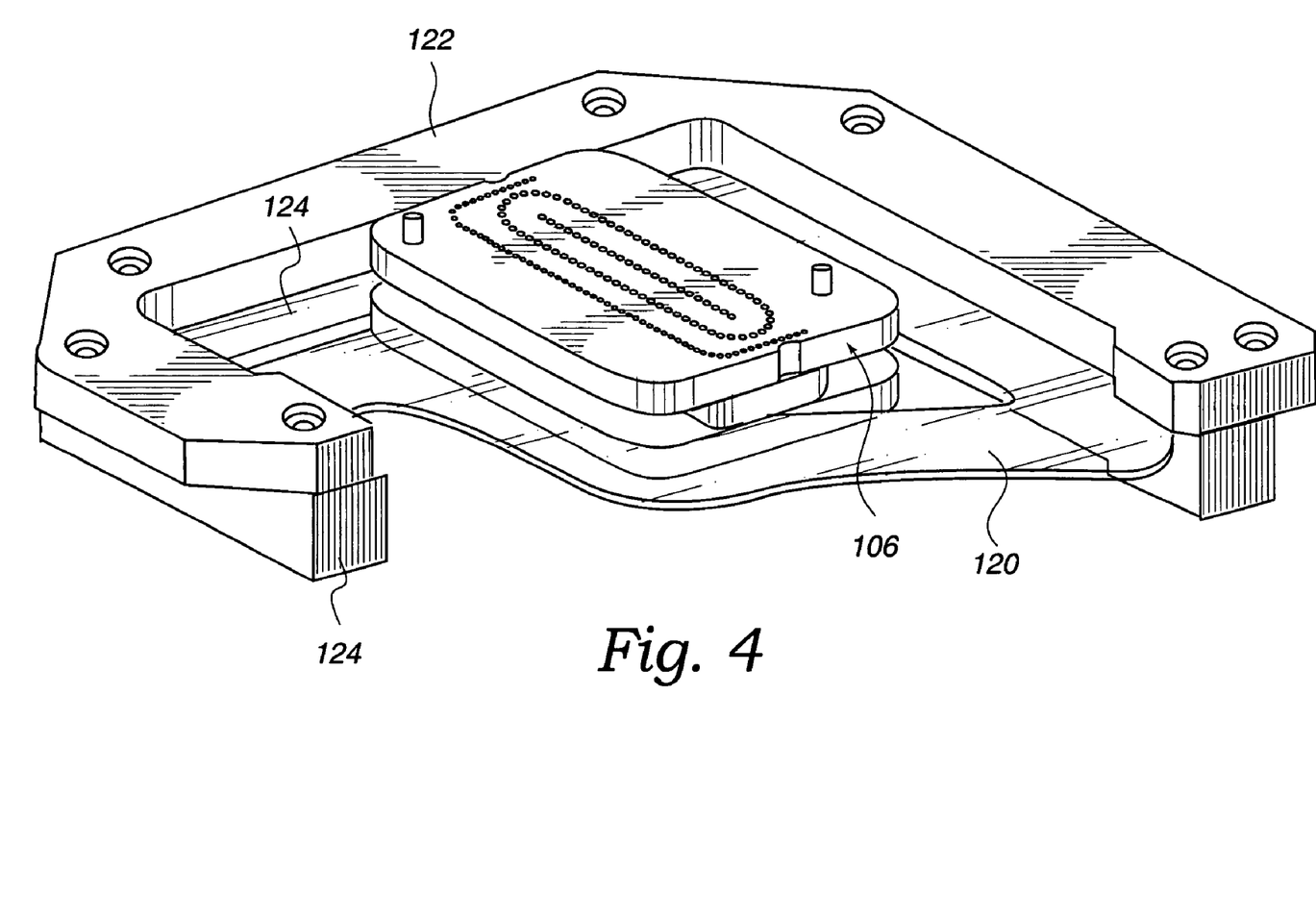
FIG. 4 depicts a more detailed view of the couple magazine with a portion of the proximity head showing inlets and outlets in accordance with one embodiment of the present invention.

FIG. 4 depicts a more detailed view of the couple magazine 126 with a portion of the proximity head 106 showing inlets and outlets in accordance with one embodiment of the present invention. In one embodiment, by varying the shape and size of the top portion 122 and the bottom portion 124, the coupon magazine 126 may be configured to hold the docking station 120 of any specific shape, such as, for example, a 200 mm docking state, a 300 mm docking state, etc. The coupon magazine 126 may also hold any suitable random shape wafer of varied size and thickness.

Figure 5:
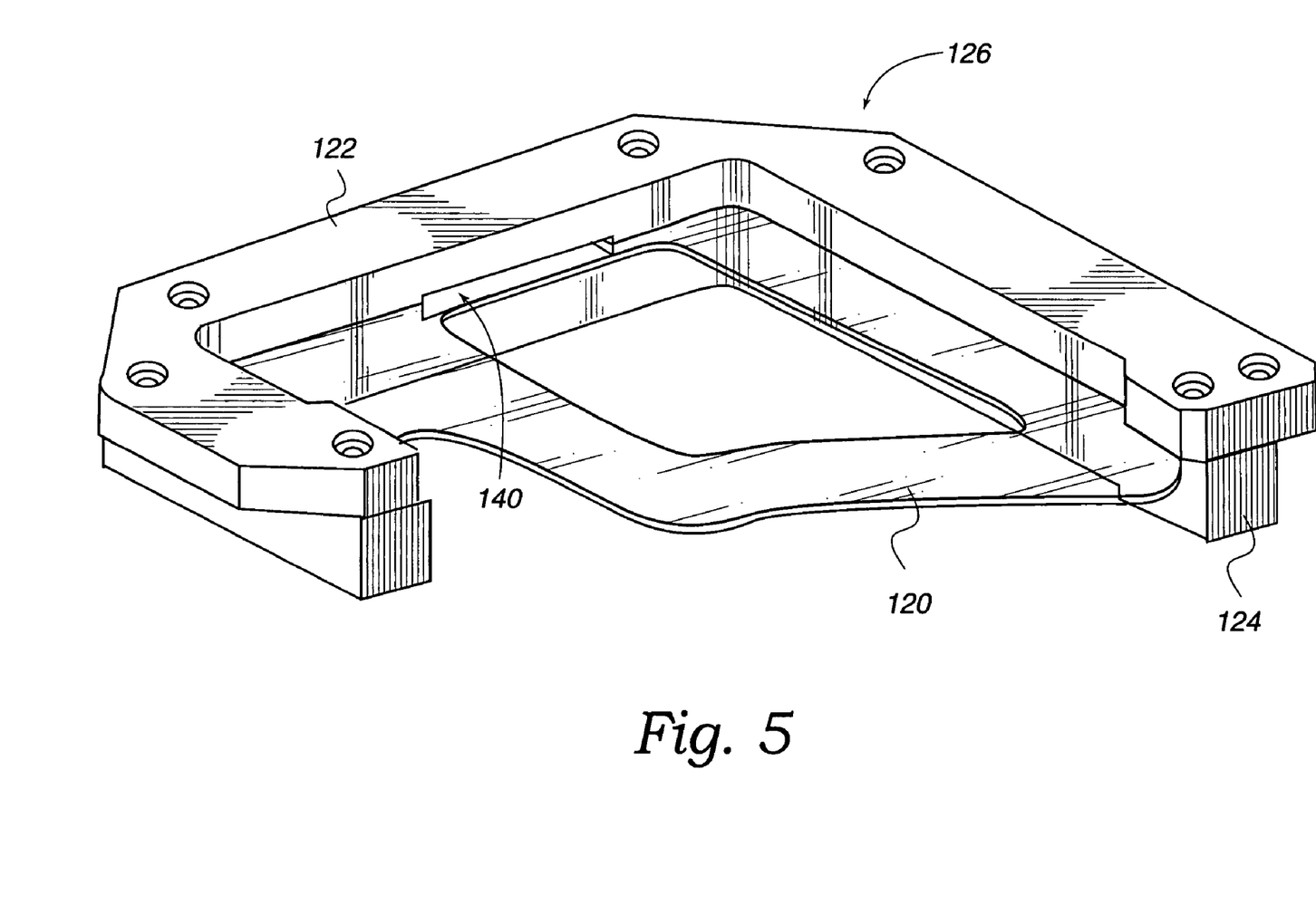
FIG. 5 shows the coupon magazine without the proximity heads in accordance with one embodiment of the present invention.

FIG. 5 shows the coupon magazine 126 without the proximity heads 106 in accordance with one embodiment of the present invention. In one embodiment, coupon magazine 126 has a sight window 140 through which may provide access to mechanically as well as visually inspect the proximity head 106a and the proximity head 106b as shown in exemplary form in FIG. 2. In this way the distance between the proximity heads 106a and 106b as well as the distance of the proximity heads 106a and 106b may be determined.

Figure 6:
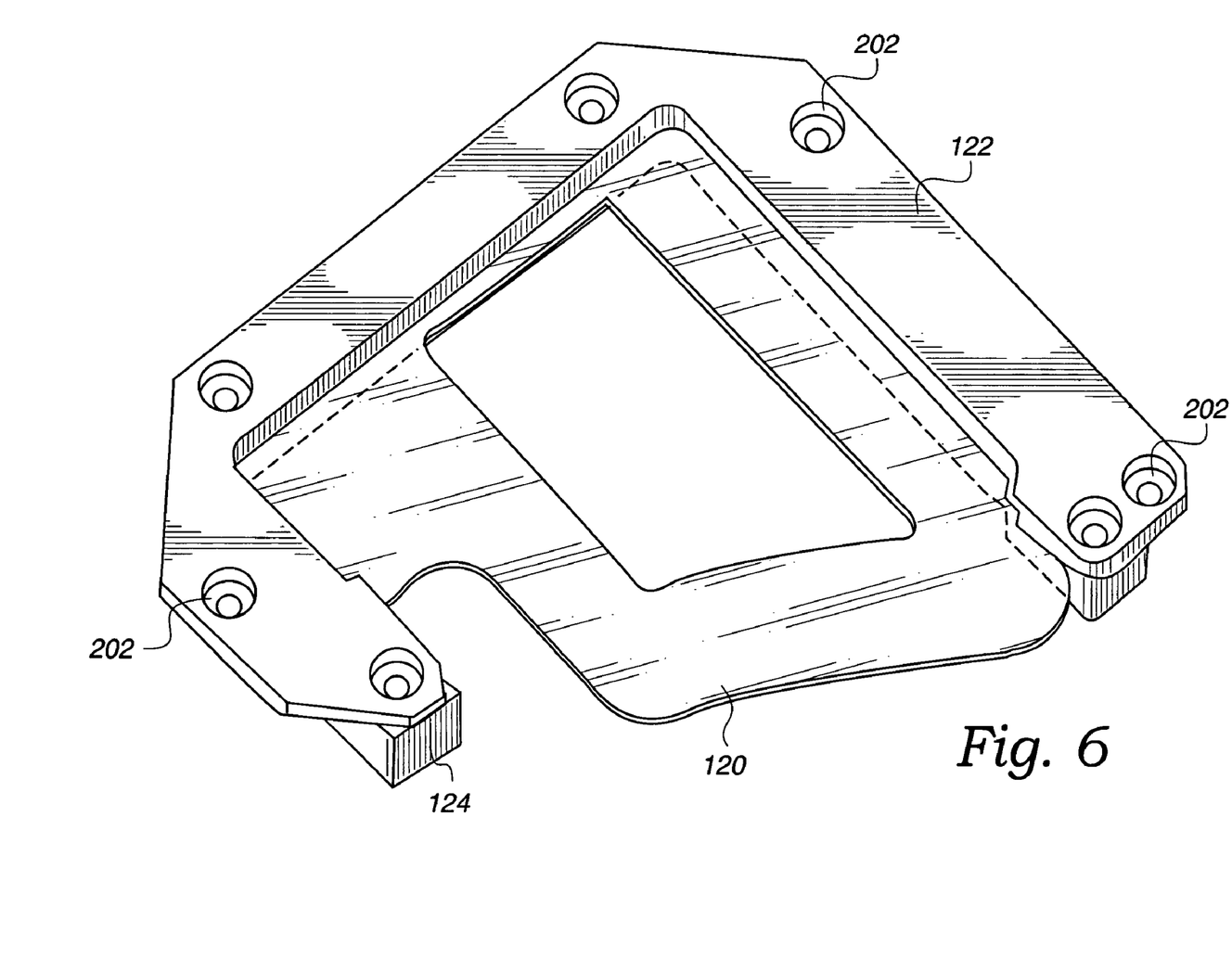
FIG. 6 shows a top view of the coupon magazine in accordance with one embodiment of the present invention.

FIG. 6 shows a top view of the coupon magazine 126 in accordance with one embodiment of the present invention. The coupon magazine 126 as shown may include attachment openings 320 through which the coupon magazine 126 may be bolted to the coupon magazine mount 128 as shown in FIG. 2A above. It should be appreciate that any suitable number, types, and/or configurations of attachment openings 320 may be utilized to attach the coupon magazine 126 to the coupon magazine mount 128. In another embodiment, the coupon magazine 126 may be attached to the coupon magazine mount by bonding without use of attachment openings 320. The coupon magazine 126 therefore may be removed at attached to the coupon magazine mount 128 in a manner so different coupon magazines with different docking stations may be interchanged in a convenient and time saving manner.

In one embodiment, a portion of the outer edge of the docking state 120 is sandwiched between the top portion 122 and the bottom portion 124 of the coupon magazine 126. In this way, the docking station 120 may be held securely during wafer processing operations. Although the docking station 120 is shown as having an opening in an interior portion, it should be appreciated that the docking station 120 may have any suitable configuration that would enable the fluid meniscus to travel from the wafer to the docking station (and vice versa) without meniscus breakdown. It should be appreciated that although the coupon magazine 126 is shown as being rectangular in shape, the coupon magazine 126 may be any suitable shape and/or configuration as long as the docking station 120 may be held securely and the proximity heads can move on and off of the docking station 120 without interference. In another embodiment, the coupon magazine may also have any suitable number of pieces such as, for example, 1, 2, 3, 4, 5, etc. as long as the docking station 120 may be held and positioned in the manner described herein.

Figure 7:
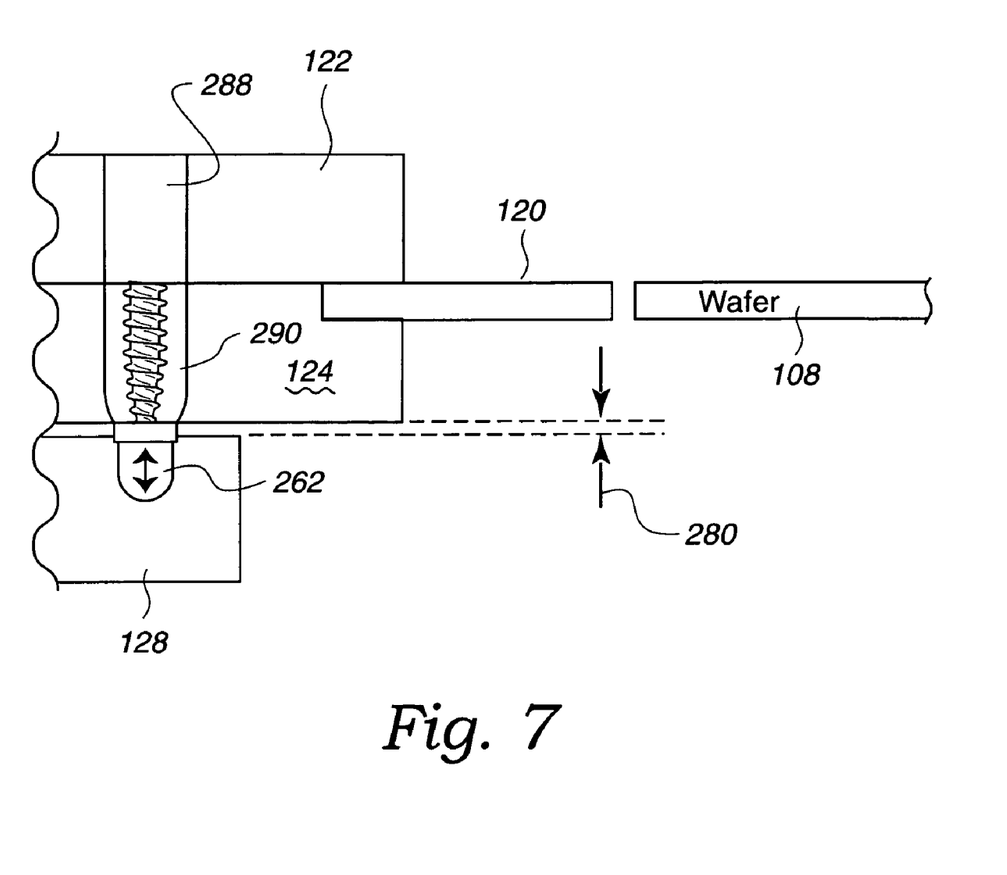
FIG. 7 shows a leveling mechanism located in the coupon magazine in accordance with one embodiment of the present invention.

FIG. 7 illustrates a leveling mechanism in accordance with one embodiment of the present invention. In one embodiment the leveling mechanism enables the moving of the coupon magazine in a vertical plane so the docking station 120 may be made substantially coplanar with the wafer 108. In one embodiment, the top portion 122 of the coupon magazine 126 may include an access port 288 which leads to a screw 290 that ends with a ball detent 262 in the coupon magazine mount 128. The screw 290 may also include a spring. The ball detent 262 which may contact the coupon assembly mount 128. In one embodiment, the spring 264 may have a force of between about 5 to 15 lbs. By turning the screw 290 the ball detent 262 may be moved vertically and then the couple magazine 126 and in turn the docking state 120 may be moved vertically. Therefore, the coupon magazine 126 may be moved in a vertical manner so the docking station 120 is made substantially level with the wafer 108. In one embodiment, the coupon magazine 126 may be moved vertically as shown by distance 280. It should be appreciated that the apparatus and method shown to move the coupon magazine 126 is just exemplary in nature and any other suitable manner of moving the coupon magazine 126 may be utilized.

Figure 8:
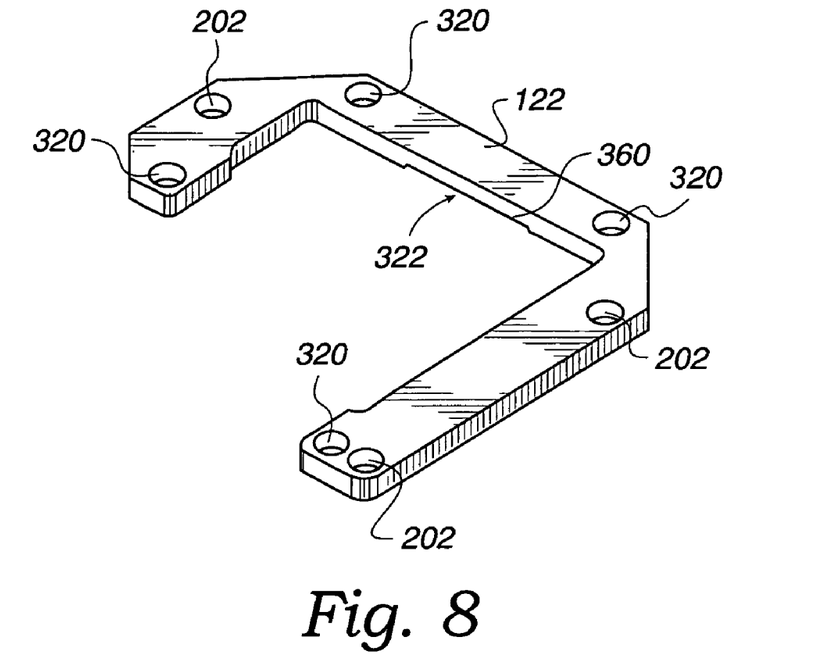
FIG. 8 shows the top portion of the coupon magazine in accordance with one embodiment of the present invention.

FIG. 8 shows the top portion 122 of the coupon magazine 126 in accordance with one embodiment of the present invention. The top portion 122 may include any suitable number and or type of attachment openings to both attach the top portion 122 to the coupon magazine mount 128 and the bottom portion 124. In one embodiment, the top portion 122 may have the attachment openings 320 for bolting the top portion 122 to the coupon magazine mount 128. The top portion 122 may also have attachment openings 202 which may be utilized to bolt the top portion 122 to the coupon magazine mount 128. The top portion 122 also may include an indentation 322 which may (when combined with the bottom portion 124) generate the sight window 140 as discussed above in reference to FIG. 5.

Figure 9:
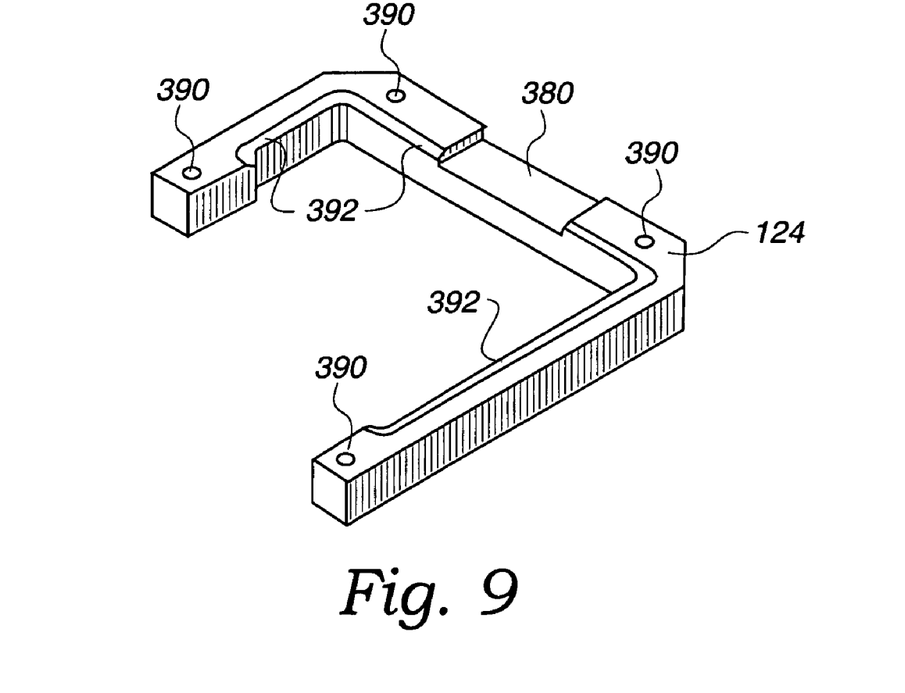
FIG. 9 illustrates the bottom portion of the coupon magazine in accordance with one embodiment of the present invention.

FIG. 9 illustrates the bottom portion 124 of the coupon magazine 126 in accordance with one embodiment of the present invention. The bottom portion 124 may include attachment openings 390 which may be aligned with the attachment openings 320 of the top portion 122. Therefore, by using the attachment openings 390, the bottom portion 124 may be bolted onto the top portion 122 to generate the coupon magazine 126. It should be appreciated that any suitable manner of attachment may be used to connect the top portion 122 to the bottom portion 124 such as, for example, gluing, bonding, etc. It should also be understood that the bottom portion 124 may have any suitable number and/or configurations of attachment openings 390.

The bottom portion 124 may also have an indentation 380 which when combined with the indentation 322 of the top portion may generate the sight window 140. In this manner, the location of the proximity heads with respect to each other and with respect to the docking station 120 may be visually and/or mechanically accessed. In addition, the bottom portion 124 may also have a recess 392 which substantially surrounds the perimeter of an internal portion of the bottom portion 124. The recess 392 may be configured so that the periphery of the docking station 120 fits within the recess 392 to provide a secure and snug attachment.

While this invention has been described in terms of several preferred embodiments, it will be appreciated that those skilled in the art upon reading the preceding specifications and studying the drawings will realize various alterations, additions, permutations and equivalents thereof. It is therefore intended that the present invention includes all such alterations, additions, permutations, and equivalents as fall within the true spirit and scope of the invention.

What is claimed is:

1. A method for processing a substrate, comprising:
positioning a transition surface substantially coplanar to a substrate surface, the transition surface being adjacent to an edge of the substrate;

generating a first fluid meniscus through a first proximity head;

generating a second fluid meniscus through a second proximity head, the first fluid meniscus and the second fluid meniscus generate a fluid meniscus; and moving a fluid meniscus onto the transition surface and then onto the substrate, such that the first fluid meniscus of the fluid meniscus moves onto a first side of the substrate and the second fluid meniscus of the fluid meniscus moves onto a second side of the substrate.

2. A method for processing a substrate as recited in claim 1, wherein positioning the transition surface includes leveling the transition surface so that the transition surface remains coplanar with the edge of the substrate.

3. A method for processing a substrate as recited in claim 1, wherein moving the fluid meniscus between the transition surface and the substrate surface includes one of moving the fluid meniscus onto the transition surface from the substrate surface and moving the fluid meniscus onto the substrate surface from the transition surface.

4. A method for processing a substrate, comprising:

positioning a transition surface substantially coplanar to a substrate surface, the transition surface being adjacent to an edge of the substrate; and positioning a first proximity head over a second proximity head, such that a fluid meniscus is generated between the first proximity head and the second proximity head, the fluid meniscus generated by supplying fluids to each of the first and second proximity heads and simultaneously removing fluids from the first and second proximity heads, such that the fluid meniscus remains stable between the first and second proximity heads; and moving a fluid meniscus over the transition surface and onto the substrate surface, the first proximity head and the second proximity head placed at opposite sides of the transition surface and the substrate, such that when the first and second proximity heads are over the transition surface, the fluid meniscus is between the respective side of the transition surface and the first and second proximity heads, and when the first and second proximity heads are over the substrate, the fluid meniscus is between the respective side of the substrate and the first and second proximity heads;

whereby the fluid meniscus is configured to move between the transition surface and the surface of the substrate, defining a time when the fluid meniscus moves between a gap defined between the transition surface and the substrate.

5. The method of claim 4, wherein positioning the transition surface includes substantially leveling the transition surface to the substrate.

6. The method of claim 4, wherein the transition surface is treated to be substantially hydrophilic.

7. The method of claim 4, wherein removing the fluid includes applying a vacuum.

8. The method of claim 4, wherein positioning transition surface includes bringing the substrate or transition surface in close proximity to one another along a curvature of the substrate.

9. The method of claim 4, further comprising:

applying an isopropyl alcohol (IPA) vapor to one or both of the first and second proximity heads, the IPA being configured to control the fluid meniscus and to remain stable during the moving.

10. The method of claim 4, wherein the preparation includes one of etching, cleaning, drying, or plating.

* * * * *